(12) United States Patent
Nonaka et al.

(10) Patent No.: US 7,671,467 B2
(45) Date of Patent: Mar. 2, 2010

(54) POWER SEMICONDUCTOR MODULE

(75) Inventors: Kenichi Nonaka, Saitama (JP); Takeshi Kato, Saitama (JP); Kenji Oogushi, Saitama (JP); Yoshihiko Higashidani, Saitama (JP); Yoshimitsu Saito, Saitama (JP); Kenji Okamoto, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 282 days.

(21) Appl. No.: 11/798,152

(22) Filed: May 10, 2007

(65) Prior Publication Data

US 2007/0262387 A1 Nov. 15, 2007

Related U.S. Application Data

(60) Provisional application No. 60/799,682, filed on May 12, 2006.

(51) Int. Cl.
*H01L 23/12* (2006.01)
*H01L 21/50* (2006.01)
*H01L 21/44* (2006.01)

(52) U.S. Cl. .................. 257/711; 438/122; 438/685

(58) Field of Classification Search ................. 257/707, 257/711, 719, 770, E23.08–E23.113; 29/832, 29/841; 438/122, 685
See application file for complete search history.

(56) References Cited

U.S. PATENT DOCUMENTS

2005/0047101 A1* 3/2005 Osanai ....................... 361/760

| 2005/0116352 A1* | 6/2005 | Warashina et al. | .......... 257/777 |
|---|---|---|---|
| 2006/0191707 A1* | 8/2006 | Ishikawa et al. | ............ 174/250 |

FOREIGN PATENT DOCUMENTS

| JP | 9-148491 A | 6/1997 |
|---|---|---|
| JP | 10-289968 A | 10/1998 |
| JP | 2000-216278 A | 8/2000 |
| JP | 2000-332170 A | 11/2000 |

OTHER PUBLICATIONS

Hopkins et al. "High-Temperature, High-Density Packaging of a 60k W Converter for >200° C Embedded Operation". © 2006 IEEE. pp. 871-877.
Casey et al. "High Temperature Considerations in SiC Power Converter Design—Package design and results". pp. 1-10.

* cited by examiner

*Primary Examiner*—Calvin Lee
(74) *Attorney, Agent, or Firm*—Birch, Stewart, Kolasch & Birch, LLP

(57) ABSTRACT

A power semiconductor module having an integral circuit board with a metal substrate electrode, an insulation substrate and a heat sink joined is disclosed. A SiC semiconductor power device is joined to a top of the metal substrate electrode of the circuit board. A difference in average coefficients of thermal expansion between constituent materials of the circuit board in a temperature range from room to joining time temperatures is 2.0 ppm/° C. or less, and a difference in expansion, produced by a difference between a lowest operating temperature and a joining temperature, of the circuit-board constituent materials is 2,000 ppm or less.

15 Claims, 2 Drawing Sheets

POWER SEMICONDUCTOR MODULE

This Nonprovisional application claims priority under 35 U.S.C. § 119(a) on Patent Application No. 60/799,682 filed in United States of America on May 12, 2006, the entire contents of which are hereby incorporated by reference.

FIELD OF THE INVENTION

The present invention relates to a power semiconductor module and, more particularly, to a power semiconductor module that may be suitably used as a power conversion device on an automobile or the like.

BACKGROUND OF THE INVENTION

Semiconductor power devices are used as inverters, DC/DC converters, and other power conversion devices. Semiconductor power devices are primarily used in the form referred to as "power semiconductor modules" in which a plurality of semi-conductor power devices is mounted.

The structure of a typical conventional power semi-conductor module is described below with reference to FIGS. 4 and 5 hereof. FIG. 4 shows a cross-sectional structure of the power semiconductor module, while FIG. 5 shows an electric circuit built into the power semiconductor module.

Examples of such semiconductor power devices include transistors in which ON/OFF operation is controlled by an external signal, diodes having rectifying characteristics, and other devices. Typical transistors include MOSFET, IGBT and the like.

FIG. 5 is an example of an inverter circuit for converting direct current to three-phase alternating current. The inverter circuit 100 comprises at least six IGBTs 101 and six diodes 102. The six IGBTs 101 are connected so as to form a bridge circuit. Each diode 102 is connected between the collector and emitter of the corresponding IGBT 101, with the forward direction being the direction that faces from the emitter toward the collector. The upper terminal 103a and lower terminal 103b on the left side of FIG. 5 are direct-current input terminals, while the three terminals 104a, 104b, and 104c on the right side of the Figure are output terminals for three-phase alternating current. When the power to be controlled is increased in the inverter circuit 100, the amount of heat produced in the semiconductor power devices is increased. Therefore, the heat must be adequately released to the outside to prevent the temperature from excessively increasing in the semiconductor power devices.

In the power semiconductor module 201 shown in FIG. 4, the IGBTs 101 and diodes 102 are generically shown as semiconductor power devices 202. These semiconductor power devices 202 are joined by using solder on a circuit board 210 that has a metal substrate electrode 211, an insulation substrate 212, and a metal substrate 213, which are layered together. A plurality of the metal substrate electrodes 211 is disposed in correspondence with the semiconductor power devices 202. Aluminum wires 222 are connected to the surface electrodes of the semiconductor power devices 202 and are connected to external electrodes 223. In the circuit board 210, the metal substrate electrode 211 and the metal substrate 213 are composed of aluminum, the insulation substrate 212 is composed of aluminum nitride, and these elements are connected to each other.

The role of the metal substrate electrode 211 is to transmit to the exterior at low loss considerable electric current that flows to the semiconductor power devices 202. A material having electrical conductivity is suitable for the metal substrate electrodes 211. Copper and aluminum are mainly used for the metal substrate electrodes 211. The role of the insulation substrate 212 is to assure electrical insulation between each of the metal substrate electrodes 211 and the metal substrate 213. The insulation substrate 212 also serves to bring heat generated in the semiconductor power devices 202 to the exterior. For this reason, a material having high insulation resistance and high thermal conductivity is needed as the insulation substrate 212. Aluminum nitride, silicon nitride, alumina and the like are commonly used for the insulation substrate 212 material.

The metal substrate electrode 211 and insulation substrate 212 are commonly joined by brazing at a high temperature of about 600° C. or higher. When cooled to room temperature after brazing, warping occurs due to stress caused by the difference in the coefficients of thermal expansion between the metal substrate electrode 211 and insulation substrate 212. The metal substrate 213 disposed in a position on the opposite side of the metal substrate electrode 211 by way of the insulation substrate 212 is used for inhibiting such warping, and the three elements in the circuit board 210, i.e., the metal substrate electrode 211, insulation substrate 212, and metal substrate 213 are joined in the same brazing step.

The entire circuit board 210 is joined to a copper base plate 225 by way of solder 224. The constituent elements of the circuit board 210 have a thickness of only 1 mm or less while the base plate 225 has a thickness of several millimeters or more. Also, the solder 224 is flexible and easily spreadable, and serves to reduce thermal stress produced between the base plate 225 and circuit board 210. The base plate 225 is connected to an aluminum heat sink 227 by way of silicone grease 226.

A resin case 228 is fixed on a top of the base plate 225. The external electrodes 223 are fixed to the resin case 228 and extend from inside the case to the exterior of the case.

When the power semiconductor module 201 is operating, a large amount of electric current flows to the semiconductor power devices 202, thus producing heat. When the power semi-conductor module 201 is viewed as a whole, the locally produced heat is transmitted from the circuit board 210 to the base plate 225, is widely dispersed in the lateral direction inside the base plate 225, travels throughout the base plate 225, and is ultimately released into the atmosphere by way of the heat sink 227. The upper-limit temperature of the joined areas of the silicon semiconductor power device is commonly about 150° C. Therefore, a heat-releasing structure is designed for the power semiconductor module so that the mounted semiconductor power devices 202 are not heated above the upper-limit temperature.

The performance of the silicon-based semiconductor power devices 202 has substantially reached theoretical limits. Semiconductor power devices that use silicon carbide (SiC) (herein-after referred to as "SiC semiconductor power devices") have received attention in recent years as an alternative. SiC semiconductor power devices can reduce loss and operate at a higher temperature than silicon semiconductor power devices. For this reason, heat generation is reduced, high-temperature operation is made possible, and the volume of the heat sink can be reduced by enabling the temperature difference between the heat sink and the outside air or the coolant to be greater in power converters and power semiconductor modules that use SiC semiconductor power devices. There are excellent possibilities for the application of SiC semiconductor power devices as very useful means for reducing the size of power semiconductor modules and power converters.

However, a conventional mounting structure cannot be applied to high-temperature operation that exceeds 200° C., which is the temperature range at which best use is made of the characteristics of a SiC semiconductor power device. Assuming that a power semiconductor module obtained using a conventional mounting technique is employed or stored in a high-temperature environment that exceeds 200° C., or in an environment with considerable variation in the minimum and maximum temperatures, the power semiconductor module will experience a critical failure because heat stress caused by the difference in the coefficients of thermal expansion between the constituent materials becomes excessively high, and the solder and other materials themselves have insufficient heat resistance.

Thus, conventional techniques for mounting semiconductor power devices are practical in the operating temperature range of silicon semiconductor power devices, but fail to provide sufficient ambient heat resistance to devices that operate effectively at higher temperatures, such as SiC semiconductor power devices. In the case that silicon semiconductor power devices are to be used, a mounting technique is needed that produces less heat-induced resistance and provides greater ambient heat resistance in order to make sufficient use of the characteristics of such devices.

Reference is now made to JP 09-148491 A1 and JP 2000-216278 A1 (U.S. Pat. No. 3,479,738), JP 2000-332170 A1 and JP 10-289968 A1 showing conventional techniques relating to the present invention.

The power semiconductor substrate disclosed in JP 09-148491 A1 comprises an insulating board made of AlN (aluminum nitride) and highly-heat-radiant composite material boards made of CuMo (copper molybdenum) and laid on front and rear surfaces of the insulating board. This document shows the substrate only and has no reference to the arrangement including a heat sink. The disclosed arrangement provides improved electrical conductivity and insulation within the power semiconductor. However, the document fails to give consideration to heat radiation.

JP 2000-216278 A1 discloses a semiconductor package which is comprised of an insulating board made of AlN (aluminum nitride) and highly-heat-radiant CuMo (copper molybdenum) composite material boards laid on front and rear surfaces of the insulating board, similarly to the arrangement of JP 09-148491.

JP 2000-332170 A1 discloses a semiconductor device which comprises a base plate made of copper (Cu) with a ceramic substrate bonded to one surface thereof. A molybdenum plate, having a coefficient of thermal expansion similar to that of the ceramic substrate, is bonded to the other surface of the base plate in positional correspondence with the ceramic substrate.

JP 10-289968 A1 is directed to a power semiconductor having an AlN board with non-wired electrically conductive patterns formed around the board. This arrangement makes it possible to suppress generation of a stress in the surface of the AlN board by virtue of balanced control of the stress generation in the front and rear surfaces of the board.

Thus, conventional techniques for mounting semiconductor power devices are practical in the operating temperature range of silicon semiconductor power devices, but fail to provide sufficient ambient heat resistance to devices that operate effectively at higher temperatures, such as SiC semiconductor power devices. In the case that silicon semiconductor power devices are to be used, a mounting technique is needed that produces less heat-induced resistance and provides greater ambient heat resistance in order to make sufficient use of the characteristics of such devices.

In the structure of the power semiconductor module shown in FIG. 4, the pathway from the semiconductor power devices 202 to the outside air is a complicated structure that begins at the solder 221; passes through the metal substrate electrode 211, the insulation substrate 212, metal substrate 213, solder 224, base plate 225, and silicone grease 226; and ends at the heat sink 227. This resulted from the object to alleviate the thermal stress produced by the difference in the coefficients of thermal expansion between the constituent materials and from the restrictions encountered in the process of manufacture.

Therefore, when power semiconductor modules are configured using a SiC semiconductor power device, the modules need to have a structure that has a simpler pathway from the semiconductor power devices to the outside air, and to have sufficient ambient heat resistance with respect to SiC semiconductor power devices that operate effectively at higher temperatures.

SUMMARY OF THE INVENTION

According to a first aspect of the present invention, there is provided a power semiconductor module comprising: an integral circuit board with a metal substrate electrode, an insulation substrate and a heat sink joined unitarily; and a semiconductor power device joined to a top of the metal substrate electrode of the circuit board, wherein a difference in average coefficients of thermal expansion between constituent materials of the circuit board in a temperature range from room to joining temperatures is set to be 2.0 ppm/° C. or less.

Throughout this specification, the term "difference in average coefficients of thermal expansion of the constituent materials of the circuit board in a temperature range from room to joining time temperatures" should be construed as having the meaning explained below.

An average of coefficients of thermal expansion in a temperature range from a room temperature to a joining time temperature (also called "joining temperature" herein; e.g., 800° C.) is obtained on each of the plural circuit-board-constituent materials (three-layered structure of a metal substrate electrode, an insulation substrate and a heat sink), and then obtained is the difference in average coefficients of thermal expansion between the materials. In this invention, the difference in coefficients of thermal expansion is set to be 2.0 ppm/° C. or less.

The "average coefficient of thermal expansion in a temperature range from room to joining time temperatures" is obtained by the following mathematical expression:

$$\int_{\text{ROOM TEMPERATURE}}^{\text{JOINING TIME TEMPERATURE}} CTE(T)\Delta T \Big/ \left( \begin{array}{c} \text{JOINING TIME TEMPERATURE}- \\ \text{ROOM TEMPERATURE} \end{array} \right)$$

$CTE(T)$: COEFFICIENT OF THERMAL EXPANSION AT TEMPERATURE $T$

In the practical joining process for the power semi-conductor module, the constituent materials are firstly set in accordance with a predetermined positional relationship at a room temperature. Then, the set materials are placed in an apparatus, followed by gradually increasing the temperature within the apparatus closely to the joining time temperature and keeping that temperature constant. Thereafter, the temperature within the apparatus is lowered gradually down to the room temperature and the power semiconductor with the constituent materials joined is taken out from the apparatus.

During the temperature drop from the joining time temperature to the room temperature after the constituent materials are joined, a stress is generated between the materials having different coefficients of thermal expansion. The magnitude of the generated stress is dependent upon a coefficient of thermal expansion in a temperature range between the room temperature and the joining temperature.

In view of the foregoing, as a difference in coefficients of thermal expansion between the constituent materials, a difference in averages of coefficients of thermal expansion the temperature range from the room temperature to the joining time temperature is utilized.

According to a second aspect of the present invention, there is provided a power semiconductor module which comprises: an integral circuit board with a metal substrate electrode, an insulation substrate and a heat sink joined unitarily; and a semiconductor power device joined to a top of the metal substrate electrode of the circuit board, wherein a difference in expansion, produced by a temperature difference between a lowest operating temperature and a joining time temperature, of constituent materials of the circuit board, is 2,000 ppm or less.

In the power semiconductor module described above, the semiconductor power device is preferably a SiC semiconductor power device.

In the power semiconductor module described above, a material of the metal substrate electrode is preferably molybdenum, tungsten, copper molybdenum, or copper tungsten.

In the power semiconductor module described above, a material of the insulation substrate is preferably aluminum nitride or silicon nitride.

In the power semiconductor module described above, a material of the heat sink is preferably a metal/carbon composite, a metal/silicon carbide composite, tungsten, molybdenum, copper molybdenum, or copper tungsten.

In the power semiconductor module described above, the semiconductor power device and the circuit board are preferably joined by using lead-free solder having a melting point of 250° C. or higher, and a difference in average coefficients of thermal expansion between the constituent materials of the semiconductor power device and the circuit in the time range from the room temperature to the joining time temperature is 5 ppm/° C. or less. The lead-free solder is preferably a gold-tin alloy.

In the power semiconductor module described above, metal wiring is joined to a surface of the semiconductor power device and a surface of the circuit board, and a difference of 5 ppm/° C. or less is maintained in the average coefficients of thermal expansion between constituent materials of the metal wiring and the semiconductor power device in the temperature range from the room temperature and the joining temperature, and in the average coefficients of thermal expansion between constituent materials of the metal wiring and the circuit board in the temperature range from the room temperature and the joining temperature.

The power semiconductor module of the present invention provides advantages as explained below.

First, the power semiconductor module of the present invention can operate at a higher temperature than a conventional power semiconductor module.

When a SiC semiconductor power device is mounted, the system can operate at temperatures in excess of 200° C., at which best use is made of the high-temperature operating characteristics of SiC. When the structure according to the present invention is applied to a silicon device, a power semiconductor module can be achieved that has higher reliability and that can operate at a higher temperature than conventional devices.

Second, since a temperature difference between a heat sink and the outside air or coolant can be increased by operating at a higher temperature, the volume of the heat sink can be dramatically reduced. Further size reduction is possible by mounting a low-loss SiC semiconductor power device.

Third, since the structure of the integral circuit board is very simple and can be manufactured in a single joining process, thereby contributing to reduced manufacturing steps and lower costs.

BRIEF DESCRIPTION OF THE DRAWINGS

Certain preferred embodiments of the present invention will be described in detail below, by way of example only, with reference to the accompanying drawings, in which.

DETAILED DESCRIPTION OF THE PREFERRED EMBODIMENTS

Figure 1:
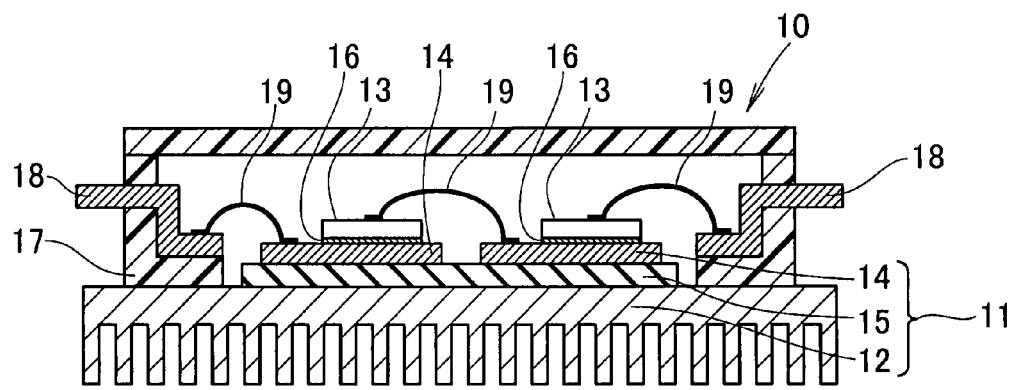
FIG. 1 is a longitudinal sectional view showing the structure of the power semiconductor module according to a first embodiment of the present invention.

A power semiconductor module according to a first embodiment of the present invention is now described with reference to FIG. 1 showing in longitudinal section the main part of the power semiconductor module according to the first embodiment.

In the power semiconductor module 10 shown in FIG. 1, circuit board 11 comprises the integration of metal substrate electrodes 14, an insulation substrate 15 and a heat sink 12. A SiC semiconductor power device is connected to each metal substrate electrode 14 via a lead solder 16. Each metal substrate electrode 14 forming an upper electrode of the SiC semiconductor power device 13 is connected via metal wiring 19 with an external electrode 18 in correspondence with the circuit arrangement within the module. A heat-resistant resin case 17 is furthermore disposed on the heat sink 12.

The metal substrate electrodes 14 are patterned in correspondence with the circuit arrangement within the power semiconductor module 10. The insulation substrate 15 may be provided in plurality on the heat sink 12.

The material of the metal substrate electrode 14 may be molybdenum (Mo), while the material of the insulation substrate 15 may be aluminum nitride (AlN), for example. The heat sink 12 may be made of a copper/carbon composite (CuC), for example. The metal wiring 19 is aluminum wiring, for example.

The power semiconductor module 10 arranged as above is provided with a heat sink-integrated circuit board 11 whose structure has only three layers. The circuit board 11 has a simplified structure but possesses the primary functions of a semiconductor power device 13, namely, the electric function for allowing flow of electrical current, the insulation function for providing insulation between the respective metal substrate electrodes 14 and between the metal substrate electrodes 14 and the heat sink, and the heat radiation function for radiating heat generated in the SiC semiconductor power device 13 to outside. Heat-induced resistance can therefore be reduced and the manufacturing process can be simplified in comparison with the structure of a conventional power semiconductor module.

The metal substrate electrodes 14, insulation substrate 15, and heat sink 12 are brazed at a temperature of 800° C. or higher, for example.

The materials used in the metal substrate electrodes 14, insulation substrate 15, and heat sink 12 in the present embodiment have the following average coefficients of thermal expansion in a temperature range from the room temperature to 800° C.: 6.0 ppm/° C. for molybdenum (Mo), 5.5 ppm/° C. for aluminum nitride (AlN), and 5.7 ppm/° C. for the copper/carbon composite (CuC). The maximum difference in the coefficients of thermal expansion between the materials of the constituent elements is only 0.5 ppm/° C.

In a conventional structure that uses aluminum and copper in the metal substrate, heat sink, and other components, the difference between the coefficient of thermal expansion of the materials of the constituent elements is as much as 10 to 20 ppm/° C.

In comparison with a conventional module, very high ambient temperature characteristics can be achieved in the power semiconductor module 10 according to the present embodiment because of the above-described difference between the coefficient of thermal expansion of the materials of the constituent elements.

The power semiconductor module 10 provided with SiC semi-conductor power devices 13 can operate normally even when repeatedly used at temperatures of 200° C. or higher. The electrical resistivity of molybdenum (Mo) is about twice that of aluminum, but the function of allowing a large electric current to flow with low loss can be sufficiently satisfied by considering thickness and other factors.

In the power semiconductor module 10 according to the first embodiment, loss can be reduced by half or more in the mounted SiC semiconductor power devices 13 in comparison with a conventional silicon semiconductor power device, and since higher temperature operation is made possible, the temperature difference between the outside air and the heat sink 12 can be doubled or more greatly increased. The size (volume) of the heat sink 12 can thereby be considerably reduced to about ⅕ the size of that in a conventional module.

Based on the above, the power semiconductor module 10 according to the first embodiment is a modular structure having the following three characteristics.

First, the circuit board 11 has a simple and multi-functional structure in which the metal substrate electrodes 14, insulation substrate 15, and heat sink 12 are integrated.

Second, since the heat stress produced in the circuit board 11 is very low, the mounted SiC semiconductor power devices 13 can operate at temperatures in excess of 200° C., and high reliability is provided in environments with a high temperature difference in which the service temperature or the storage temperature of the power semiconductor module is very low, such as −40° C.

Third, the volume of the heat sink 12 can be dramatically reduced in comparison with a conventional module because the SiC semiconductor power devices 13 have low loss, and the temperature difference between the heat sink 12 and the outside air can be increased.

TABLE 1 below shows a portion of the results of a temperature cycle test carried out in a temperature range of −40° C. to 200° C. for various circuit board structures that include the circuit board 11 according to the first embodiment described above.

TABLE 1

Temperature cycle test results for circuit boards

| Structure | Difference in average coefficients of thermal expansion between room and joining temp. (ppm/° C.) | Difference in average coefficients of thermal expansion between 200° C. and room temp. (ppm/° C.) | Test results |
| --- | --- | --- | --- |
| Mo/AlN/CuC | 0.5 | 2.3 | 10,000 cycles with no abnormalities |
| W/AlN/W | 0.6 | 0.6 | 10,000 cycles with no abnormalities |
| CuMo/Al$_2$O$_3$/CuC | 2.4 | 1.6 | ceramic cracks at 100-2,000 cycles |
| Al/AlN/CuC | 23 | 20.5 | ceramic cracks at 100-2,000 cycles |
| Mo/AlN/Al | 23 | 20.5 | ceramic cracks at 100-2,000 cycles |
| Al/AlN/Al | 23 | 20.5 | ceramic cracks at 100-2,000 cycles |

Beginning with the structure of the circuit board 11 adopted in the first embodiment, abnormalities were not observed in long-term temperature cycle tests when the difference in the average coefficients of thermal expansion is small between the constituent materials at the temperature range from the room temperature to 600-800° C., which is a common circuit board joining temperature.

On the other hand, damage resulted early in the thermal cycle test in structures in which the difference in the average coefficients of thermal expansion was very large between the constituent materials in which Al, Cu, or the like were used. Damage also occurred early in structures in which Al and Cu were not used, such as CuMo/Al$_2$O$_3$/CuC. When Mo/AlN/CuC and CuMo/Al$_2$O$_3$/CuC are compared, Mo/AlN/CuC has a smaller difference in the average coefficients of thermal expansion of the constituent materials in the temperature range from the room to the joining time temperatures, but CuMo/Al$_2$O$_3$/CuC has a smaller difference in the average coefficients of thermal expansion in the temperature range from the room temperature to 200° C., which was the maximum temperature of the temperature cycle test. The results of the temperature cycle test show that Mo/AlN/CuC had no abnormalities, but CuMo/Al$_2$O$_3$/CuC was damaged early in the test.

It is apparent from the above results that in the effects on the ambient heat resistance of the circuit board structure, the difference in the average coefficients of thermal expansion of the constituent materials in the temperature range from the room temperature to the joining time temperature should be greater than the difference in the average coefficients of thermal expansion of the materials in the temperature range from the room to the operating temperature, and that the coefficient of thermal expansion between the joining temperature and the room temperature must be about 2 ppm/° C. or less.

In addition to the examples of materials shown in TABLE 1 above, a copper/molybdenum composite can be used for the metal substrate electrodes 14, and AlSiC or the like may be used for the heat sink 12. Any material can be used as long as the constituent materials are selected such that the difference in the average coefficients of thermal expansion between the materials in the temperature range from the room temperature to the joining time temperature is 2 ppm/° C. or less.

A greater difference in the coefficients of thermal expansion would be allowed if joining could be performed at lower temperatures. A criterion for such a case is the difference in the expansion ratios of the constituent materials produced by the difference between the joining temperature and the storage environment temperature or the operating minimum temperature. In the examples in TABLE 1, the joining temperature is 800° C. and the operating minimum temperature is −40° C. W/SiN/CuC had the largest difference in the expansion ratios of the constituent materials of the circuit boards with good temperature cycle test results, and the value was 1,300 ppm. Conversely, CuMo/Al$_2$O$_3$/CuC had the smallest difference in the expansion ratios of the constituent materials of the circuit boards that were damaged early in the temperature cycle test, and the value was 2,000 ppm. Based on these facts, it is apparent that the difference in the expansion ratios of the constituent materials produced by the difference between the joining temperature and the storage environment temperature or the operating minimum temperature is preferably 2,000 ppm or less when the operating maximum temperature exceeds 200° C. and the storage environment temperature or the operating minimum temperature is 0° C. or less.

Figure 2:
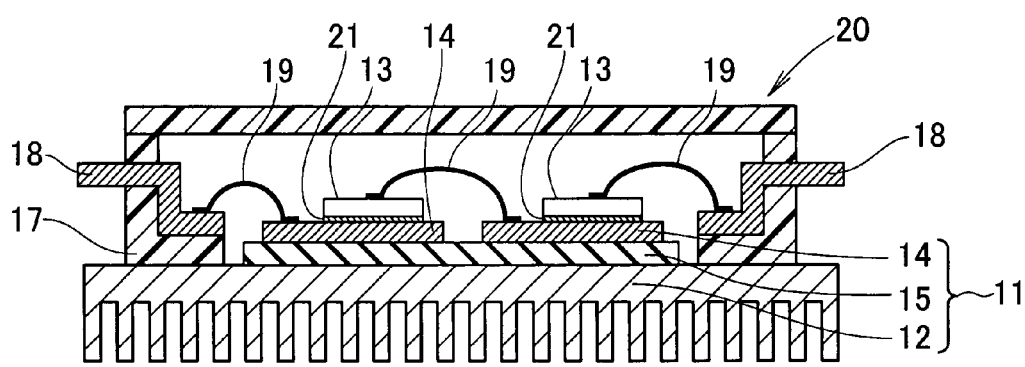
FIG. 2 is a longitudinal sectional view showing the structure of the power semiconductor module according to a second embodiment of the present invention.

A second embodiment of the power semiconductor module according to the present invention is described next with reference to FIG. 2 showing in longitudinal section the main part of the power semiconductor module 20 according to the second embodiment. In FIG. 2, the same reference numerals are used as those used for the elements described in FIG. 1.

In the power semiconductor module 20 shown in FIG. 2, a circuit board 11 whose structure is integrated with a heat sink 12 is provided as a board portion with an insulation substrate 15 and a metal substrate electrodes 14 prepared in accordance with each of the SiC semiconductor power devices 13. The SiC semiconductor power devices 13 are fixed to the tops of the metal substrate electrodes 14 by using AuSn solder (high-temperature lead-free solder) 21. The structure other than the above is the same as the structure described in the first embodiment.

In the power semiconductor module 20 according to the first embodiment, the SiC semiconductor power devices 13 were joined to the tops of the metal substrate electrodes 14 by using conventionally known solder 16. However, the module must be compatible with the globally pursued tendency for using lead-free structures. In the current situation, lead-free solder is not available that can be used to assure sufficient long-term reliability in a temperature environment that exceeds 200° C. AuSn, AuSi, and the like are possible candidates from the aspect of the melting point, but these solders are hard in comparison with conventional lead solder. Therefore, the boundary between the solder and the semiconductor power device, or the boundary between the solder and the metal substrate electrodes 14, peels away due to temperature cycles, the semiconductor power devices are damaged, and other unwanted phenomena occur when these solders are used to join semiconductor power devices with the aluminum, copper, and other metal substrate electrodes 14 primarily used in the past.

In the second embodiment, high ambient temperature resistance can be achieved even when AuSn solder 21 is used. This is because of the small difference in the average coefficients of thermal expansion between the SiC semiconductor power devices 13 and the metal substrate electrodes 14 of the integral circuit board 11. The difference is 3 ppm/° C. or less at about 300° C., which is the joining temperature of AuSn 21 solder.

TABLE 2 below shows the results of joining SiC semiconductor power devices to two different types of circuit board structures by using AuSn solder, and performing a temperature cycle test in a temperature range of −40° C. to 200° C. Abnormalities were observed early in the test in the conventional structure, i.e., Al/AlN/Al, but abnormalities were not observed at 10,000 cycles in the structure of the present embodiment, i.e., Mo/AlN/CuC.

TABLE 2

| Temperature cycle test results for AuSn | |
|---|---|
| Structure | Results |
| Mo/AlN/CuC | 10,000 cycles with no abnormalities |
| Al/AlN/Al | Chip cracking at 100 to 1,000 cycles |

It is apparent from the results that in the structure of the present embodiment, AuSn solder, which is difficult to use in conventional structures, can be used even in a severe temperature environment once sufficient reliability is ensured. This is because the difference in the coefficients of thermal expansion is small between the SiC semiconductor power devices and the integral circuit board.

The suitable upper-limit temperature of the solder joint of the SiC semiconductor power devices 13 is set to about 400° C. in order to be able to use existing devices and because of other considerations. Considering that the above-described test results and that the joining temperature is about half that of an integral circuit board, the difference in the average coefficients of thermal expansion between the constituent materials of the SiC semiconductor power devices 13 and the integral circuit board 11 in the temperature range from the room to the joining time temperatures is thought to preferably be about 5 ppm/° C. or less.

In the power semiconductor module 20 according to the second embodiment, the mounted SiC semiconductor power devices 13 operate at temperatures in excess of 200° C. even in lead-free structures, and high reliability is provided in environments with a high temperature difference. These environments include those in which the service temperature or the storage temperature of the power semiconductor module is very low, such as −40° C.

Figure 3:
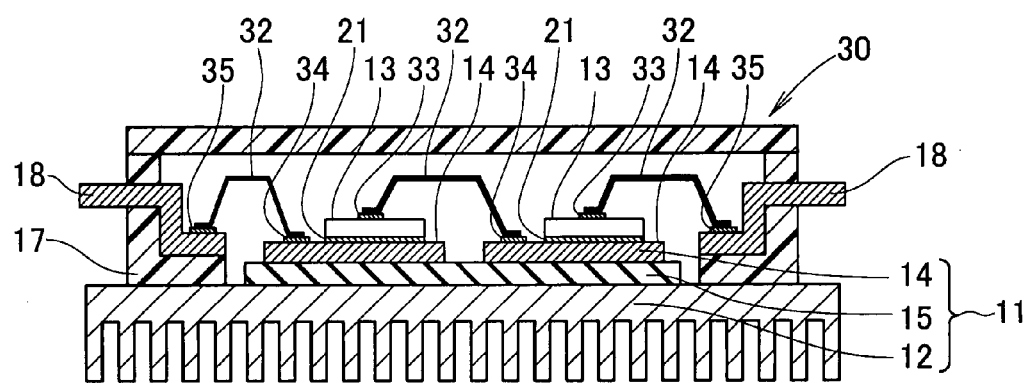
FIG. 3 is a longitudinal sectional view showing the structure of the power semiconductor module according to a third embodiment of the present invention.
Figure 4:
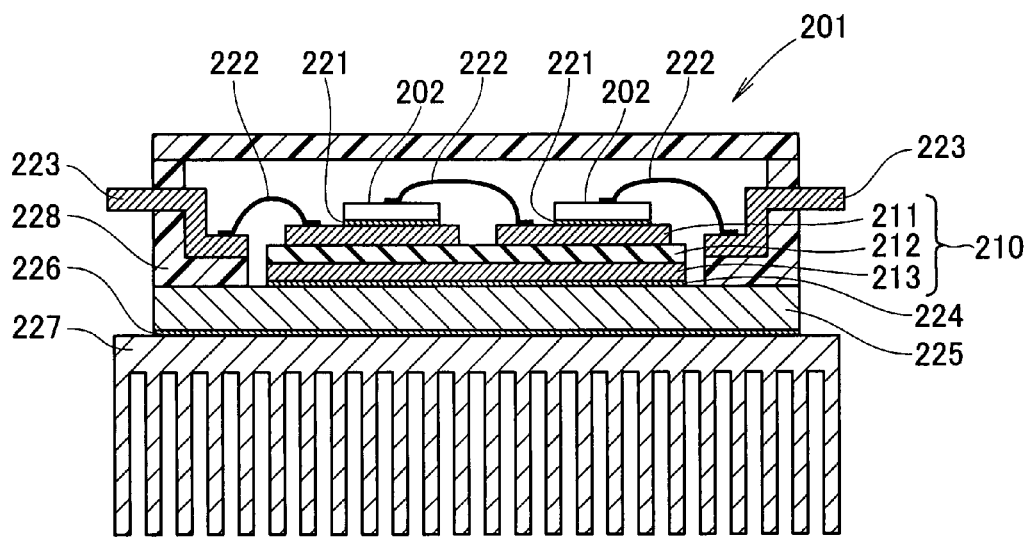
FIG. 4 is a longitudinal sectional view showing the structure of a typical conventional power semiconductor module.
Figure 5:
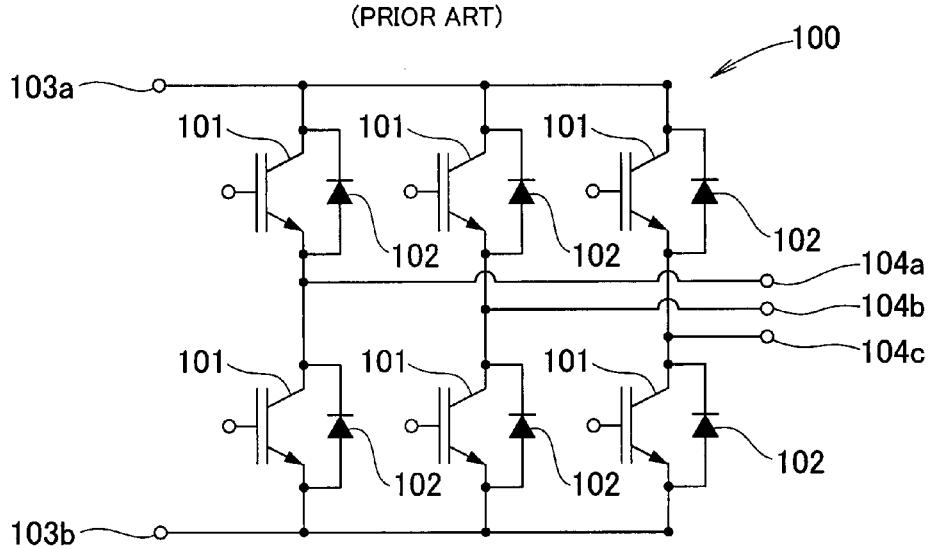
FIG. 5 is an electric circuit diagram showing a bridge circuit built into a conventional power semiconductor module.

A third embodiment of the power semiconductor module according to the present invention is described next with reference to FIG. 3. FIG. 3 is a longitudinal sectional view showing the main part of the power semiconductor module 30 according to the third embodiment. In FIG. 3, the same reference numerals are used as those used for the elements described in FIG. 2.

In the power semiconductor module 30 shown in FIG. 3, a circuit board 11 whose structure is integrated with a heat sink 12 is provided as a board portion with an insulation substrate 15 and metal substrate electrodes 14 prepared in accordance with SiC semiconductor power devices 13 in the same manner as in the first and second embodiments described above. The SiC semiconductor power devices 13 are joined and fixed to the tops of the metal substrate electrodes 14 by using AuSn solder (high temperature lead-free solder) 21, and electrical connections are provided from the surfaces of the SiC semiconductor power devices 13 to the exterior by way of plate-shaped CuMo metal wiring 32. The metal wiring 32 and the surfaces of the SiC semiconductor power devices 13 are joined using AuSn solder 33. The structure other than the above is the same as the structure described in the second embodiment.

In the power semiconductor module 30 according to the third embodiment, the ambient heat resistance can be increased beyond that of the first and second embodiments described above by using the metal wiring 32, which is strong and has a coefficient of thermal expansion that is approximate to that of the SiC semiconductor power devices 13 and integral circuit board 11.

In the first and second embodiments described above, examples were shown in which Al wires 19 were used to provide connections from the surfaces of the SiC semiconductor power devices 13 to the exterior. However, reliability cannot be assured with Al wires 19 in severe conditions in which the temperature of the SiC semiconductor power devices 13 is 250° C. or higher.

In view of this fact, strong plate-shaped metal wiring 32 composed of CuMo is used in place of Al wires 19 in the present embodiment. The typical CuMo wire structure has a width of 1 mm and a thickness of 0.2 mm, for example. AuSn solder 33 is used to join the SiC semiconductor power devices 13.

In comparison with Al wires, CuMo metal wiring 32 assures high reliability in high-temperature operation because the strength and heat resistance are high, and the coefficient of thermal expansion is approximate to that of the SiC semiconductor power devices 13 and the integral circuit board 11.

In the power semiconductor module 30 of the present embodiment, normal operation has been confirmed even when the module is repeatedly operated in environments in which the temperature of the SiC semiconductor power devices 13 reaches 250° C.

The difference in the average coefficients of thermal expansion between the constituent materials of the metal wiring 32 and the SiC semiconductor power devices 13 in temperature range from the room temperature to the joining time temperature is preferably 5 ppm/° C. or less for the same reason as that described for the joining of the SiC semiconductor power devices 13 and the integral circuit board 11. The difference in the coefficients of thermal expansion between the metal wiring 32 and the integral circuit board 11 is also important, and for the same reason AuSn solder 34 is used and the difference in the coefficients of thermal expansion is similarly preferably kept at 5 ppm/° C. or less at the time of joining. Any solder 35 can be used in the joint between the metal wiring 32 and the external electrodes 18. As can be readily appreciated by a skilled artisan, molybdenum may be employed for the metal wiring 32 in place of CuMo.

Obviously, various minor changes and modifications of the present invention are possible in light of the above teaching. It is therefore to be understood that within the scope of the appended claims the invention may be practices otherwise than as specifically described.

What is claimed is:

1. A power semiconductor module comprising:
an integral circuit board with a metal substrate electrode, an insulation substrate and a heat sink joined unitarily; and
a semiconductor power device joined to a top of the metal substrate electrode of the circuit board,
wherein a difference in average coefficients of thermal expansion between constituent materials of the circuit board in a temperature range from a room temperature to a joining time temperature is 2.0 ppm/° C. or less.

2. The power semiconductor module of claim 1, wherein the semiconductor power device comprises a SiC semiconductor power device.

3. The power semiconductor module of claim 1, wherein the metal substrate electrode is made of a material selected from the group consisting of molybdenum, tungsten, copper molybdenum, and copper tungsten.

4. The power semiconductor module of claim 1, wherein the insulation substrate is made of a material selected from the group consisting of aluminum nitride and silicon nitride.

5. The power semiconductor module of claim 1, wherein the heat sink is made of a material selected from the group consisting of a metal/carbon composite, a metal/silicon carbide composite, tungsten, molybdenum, copper molybdenum, and copper tungsten.

6. The power semiconductor module of claim 1, wherein
the semiconductor power device and the circuit board are joined by using lead-free solder having a melting point of 250° C. or higher, and
a difference in average coefficients of thermal expansion between the constituent materials of the semiconductor power device and the circuit in the time range from the room temperature to the joining time temperature is 5 ppm/° C. or less.

7. The power semiconductor module of claim 6, wherein the lead-free solder comprises a gold-tin alloy.

8. The power semiconductor module of claim 1, wherein
metal wiring is joined to a surface of the semiconductor power device and a surface of the circuit board; and
a difference of 5 ppm/° C. or less is maintained in the average coefficients of thermal expansion between constituent materials of the metal wiring and the semiconductor power device in the temperature range from the room temperature and the joining temperature, and in the average coefficients of thermal expansion between constituent materials of the metal wiring and the circuit board in the temperature range from the room temperature and the joining time temperature.

9. A power semiconductor module comprising:
an integral circuit board with a metal substrate electrode, an insulation substrate and a heat sink joined unitarily; and
a semiconductor power device joined to a top of the metal substrate electrode of the circuit board,
wherein a difference in expansion, produced by a difference in temperature between a lowest operating temperature and a joining temperature, of constituent materials of the circuit board, is 2,000 ppm or less.

10. The power semiconductor module of claim 9, wherein the semiconductor power device comprises a SiC semiconductor power device.

11. The power semiconductor module of claim 9, wherein the metal substrate electrode is made of a material selected from the group consisting of molybdenum, tungsten, copper molybdenum, and copper tungsten.

12. The power semiconductor module of claim 9, wherein the insulation substrate is made of a material selected from the group consisting of aluminum nitride and silicon nitride.

13. The power semiconductor module of claim 9, wherein the heat sink is made of a material selected from the group consisting of a metal/carbon composite, a metal/silicon carbide composite, tungsten, molybdenum, copper molybdenum, and copper tungsten.

14. The power semiconductor module of claim 9, wherein the semiconductor power device and the circuit board are joined by using lead-free solder having a melting point of 250° C. or higher, and a difference in average coefficients of thermal expansion between the constituent materials of the semiconductor power device and the circuit in the time range from the room temperature to the joining time temperature is 5 ppm/° C. or less.

15. The power semiconductor module of claim 9, wherein metal wiring is joined to a surface of the semiconductor power device and a surface of the circuit board; and a difference of 5 ppm/° C. or less is maintained in the average coefficients of thermal expansion between constituent materials of the metal wiring and the semiconductor power device in the temperature range from the room temperature and the joining temperature, and in the average coefficients of thermal expansion between constituent materials of the metal wring and the circuit board in the temperature range from the room temperature and the joining time temperature.

* * * * *